United States Patent [19]

Ackley et al.

[11] Patent Number: 4,623,427

[45] Date of Patent: Nov. 18, 1986

[54] MEANS AND METHOD FOR A SELF-ALIGNED MULTILAYER LASER EPITAXY STRUCTURE DEVICE

[75] Inventors: Donald E. Ackley, Lambertville, N.J.; Reinhart W. H. Engelmann, Mountain View; Teruko K. Inouye, Palo Alto, both of Calif.

[73] Assignee: Hewlett-Packard Company, Palo Alto, Calif.

[21] Appl. No.: 522,918

[22] Filed: Aug. 12, 1983

[51] Int. Cl.$^4$ .................. H01L 21/20; H01L 21/306; H01S 3/19

[52] U.S. Cl. .................. 156/647; 156/649; 156/612; 148/175; 29/580; 29/569 L; 357/55; 357/17; 372/46

[58] Field of Search .............. 156/625, 662, 647, 612, 156/654, 655, 657, 649; 252/79.1, 79.2; 29/576 E, 576 W, 576 T, 580, 569 L; 148/171, 175; 357/55, 56, 16, 17, 18, 60; 372/43, 46, 45

[56] References Cited

U.S. PATENT DOCUMENTS

| | | | |
|---|---|---|---|
| 4,033,796 | 7/1977 | Burnham et al. | 29/580 X |
| 4,099,305 | 7/1978 | Cho et al. | 29/580 X |
| 4,166,253 | 8/1979 | Small et al. | 372/46 X |
| 4,433,417 | 2/1984 | Burnham et al. | 372/46 X |
| 4,503,539 | 3/1985 | Mori et al. | 372/45 |

OTHER PUBLICATIONS

Lida et al., "Selective Etching of GaAs in $H_2SO_4$-$H_2O_2$-$H_2O$ System", J. Electrochemical Soc., vol. 118, No. 5, May 1971, pp. 768-771.

Tijburg et al., "Selective Etching of III-V Compounds with Redox System", J. Electrochemic Soc., vol. 123, No. 5, May 1976, pp. 687-691.

Otsubo et al., "Preferential Etching of GaAs through Photoresist Masks", J. Electrochemical Soc., vol. 123, No. 5, May 1976, pp. 676-680.

Shima et al., "Buried Convex Waveguide Structure (GaAl)As Injection Lasers", Appl. Phys. Lett., vol. 38, No. 8, Apr. 1981, pp. 605-607.

Tsang et al., "Profile and Groove-Depth Control in GaAs . . . Etching in $H_2SO_4$-$H_2O_2$-$H_2O$ System", Applied Physics Letters, vol. 28, No. 1, Jan. 1, 1976, pp. 44-46.

"Physics of Semiconductor Devices", S. M. Sze, Wiley-Interscience, 1969, pp. 452-455 and 470-473.

Primary Examiner—Edward Kimlin
Assistant Examiner—Ramon R. Hoch
Attorney, Agent, or Firm—Edward Y. Wong

[57] ABSTRACT

A method of forming the proper metallization contacts in a multilayer epitaxy laser device is provided. By selecting the proper crystal plane orientation in etching nonplanar features like channels for the device, a differential etch rate in a free-etch can be effected to remove only selected portions of the top layer and to provide self-alignment in the metallization process.

4 Claims, 4 Drawing Figures

MEANS AND METHOD FOR A SELF-ALIGNED MULTILAYER LASER EPITAXY STRUCTURE DEVICE

BACKGROUND AND SUMMARY OF THE INVENTION

Many stripe-geometry semiconductor laser devices exhibit a lateral built-in guiding structure. Such guiding structures are usually fabricated by nonplanar growth over channels and terrace or mesa stripes via a multilayer liquid, vapor-phase or molecular beam epitaxy. Most of these prior art structures require a mask step to realign the ohmic contact stripe in the top epitaxial layer to confine the laser pumping current to the lateral built-in guiding structure itself. And to achieve superior device performance, accuracy of realignment is therefore critical. In the prior art, accuracy to within a micron is highly desirable; otherwise, device yield and performance are greatly degraded. Hence, the realignment process has evolved into a tedious process to achieve the required precision in alignment.

In the prior art two techniques that do not require this tedious realignment process in the fabrication of a multilayer epitaxy laser device are known, though not widely used. Furthermore, these two techniques themselves present additional problems and disadvantages.

One of the two has been reported by Shima et al. in "Buried Convex Waveguide Structure (GaAl)As Injection Lasers", (*Appl. Phys. Lett.* 38 (8), 15 Apr. 1981). In this report is described a self-aligned inner-stripe technique. It describes the requirement of a time-consuming epitaxial growth process both prior to and after etching or milling the nonplanar surface features into the substrate. Having both of these epitaxial growth processes represents an additional one to the usual growth process commonly used in fabricating multilayer epitaxy structures. Furthermore, the added epitaxial growth process requires relatively tight tolerances of growth thickness and thickness uniformity. And in the second technique, reported by Mori et al. in "Single Mode Laser with a V-shaped Active Layer Grown by Metalorganic Chemical Vapor Deposition: a V-shaped Double Heterostructure Laser" (*J. Appl. Phys.* 52(2), 5429 September 1981), a self-aligned V-guide technique is described. This technique requires an anomalous zinc diffusion process that is difficult to control and reproduce. The technique in accordance with the preferred embodiment of the invention, however, readily overcomes these prior art self-alignment problems as well as those inherent with the realignment techniques.

In accordance with the invention, an epitaxial growth process which allows grown epitaxial layers to retain, up to the topmost layer, some aspect of the nonplanar stripe-shaped surface features that are etched or milled into the substrate, is selected. An example of such an epitaxial growth process is that of organometallic vapor phase epitaxy (OMVPE), or metalorganic chemical vapor depositon (MOCVD). In this process, a proper combination of crystallographic substrate orientation, stripe orientation, cross-sectional shape and height of the surface feature in the substrate, for example, channel depth or terrace or mesa height, and epitaxial layer thickness of the multilayer structure is judiciously chosen. The top epitaxial layer is chosen to be a state-of-the-art, highly doped p-type (p+) contacting, or "cap", layer. Portions of this p+ cap layer on the planar surface of the multilayer structure are selectively removed in a free-etch process, that is, in a process using varying etch rates for differing crystallographic planes, or faces, in a semiconductor substrate. This novel application of a varying etch rate in the processing of a cap layer allows self-alignment and obviates the need of precise realignment etch masks. Specifically, when the selected portion of the p+ cap layer has been removed by etching, only the part of the p+ cap layer on the stripe-shaped surface remains. Metallization of the top layer then results in a nonblocking ohmic contact only to the remaining p+ cap layer stripes. This ensures the occurrence of selective pumping of the nonplanar guiding structure in the area located underneath these contacting off-planar surface stripes.

DETAILED DESCRIPTION OF THE INVENTION

Figure 1A:
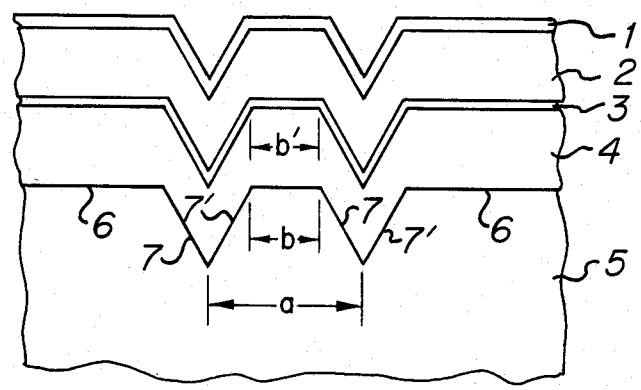
FIGS. 1A and 1B show the preferred embodiment of the invention.

FIG. 1 shows a cross-section of a state-of-the-art twin-channel substrate-mesa-guide (TCSM) laser structure which is known to operate in a zero-order lateral mode if dimension b' is kept between 1 and 2 microns. The n-type GaAs substrate wafer 5 is oriented in a (100) crystal plane 6. Two V-channels 7—7' are etched into the substrate surface 6 along a [01$\bar{1}$] crystal direction using a nonisotropic etch, for example, a solution of 3:1:20 $H_2SO_4$: 30% $H_2O_2$:$H_2O$, which exposes the (111)A planes 7 and 7'. The V-channel depth is typically 1.5 microns and the center-to-center spacing a between the V-channels is typically 4 microns. OMVPE growth of four layers follows, each layer closely replicating the V-channels on its surface: an n-type $Ga_{1-x}Al_xAs$ confining layer 2 typically 1.5 microns thick, a $Ga_{1-y}Al_yAs$ active layer 3 typically 0.05 microns thick, a p-type $Ga_{1-x}Al_xAs$ confining layer 4 typically 1.2 microns thick, and a highly doped p-type (p+) GaAs cap layer 1 typically 0.3 microns thick. The Al mole fractions are typically $x=0.4$ and $y=0.05$.

Figure 1B:
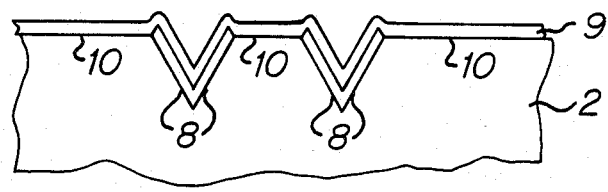

In accordance with the preferred embodiment of the invention the unmasked wafer surface is then exposed to a non-isotropic etch having a fast etch rate for (100) planes and a slow etch rate for (111)A planes. As a result a stripe-shaped part 8 of the p+ cap layer remains on the (111)A planes in the channels as shown in FIG. 1B, whereas the p+ cap layer is completely removed on the planar (100)-oriented surface 10 of the wafer. A properly chosen subsequent metallization layer 9, for example, a Ti-Pt double layer, is next applied to form a current blocking contact to the p confining layer 2 and an ohmic low-resistance contact to the remaining stripe 8 of the p+ cap layer. In this way, the proper metallization contacts are achieved in a self-aligned manner.

For free-etching the p+ cap layer the same or a similar etch solution as the one for etching the V-channels into the substrate can be used, that is, 3:1:20 $H_2SO_4$: 30% $H_2O_2$:$H_2O$. The etch rate at 21° C. etch temperature is approximately 0.7 micron/minute on a (100) face but only about 0.25 micron/minute on a (111)A face. Thus, after approximately 30 seconds of etch time, a 0.3 micron thick p+ cap layer is thus completely removed on the (100) face and a final thickness of about 0.1 micron remains on the original p+ cap layer on the (111)A faces in the V-channels to provide ohmic contact stripes for laterally pumping the central mesa stripe of width b' in the active layer 3.

Stable, single-mode lasers with at least 40 mW output power per facet have been fabricated in this way. These lasers typically exhibited less than 40 mA threshold current for a 300-micron spacing between the cleaved [01$\bar{1}$] facets forming the optical cavity length.

Figure 2A:
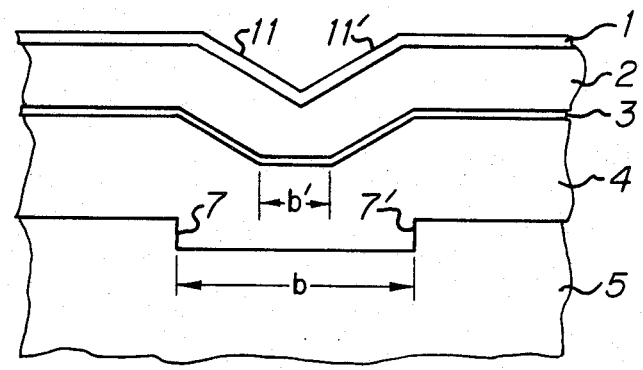
FIGS. 2A and 2B show an alternate embodiment of the invention.
Figure 2B:
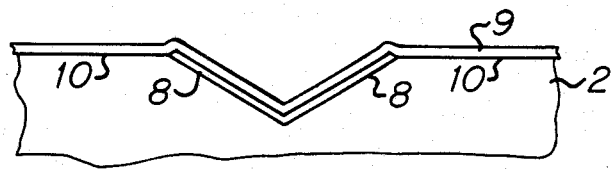

For another embodiment of this invention, as shown in a cross-sectional view in FIGS. 2A and 2B, a nearly rectangular shaped channel 7—7' is etched along a [011] direction into a (100) oriented n-type GaAs substrate 5 using, for example, a 3:1:20 NH$_4$OH: 30% H$_2$O$_2$:H$_2$O etch solution. The channel is typically 8 to 9 microns wide and 1 micron deep. A similar four-layer structure is grown by OMVPE as described above for the TCSM structure with the n-type confining layer 4 typically 2-3 microns thick, the active layer 3 typically 0.05 micron thick, the p-type confining layer 2 typically 1 to 1.5 microns thick, and the p+ cap layer 1 typically 0.3 micron thick. Because of the peculiarities of OMVPE growth the rectangular-shaped channel of the substrate causes a channel with sloped walls and a flat bottom of typically 1-2 microns width b' to form in the active layer 3, which provides for lateral built-in guiding, and a pointed V-channel to form on the top surface of the p+ cap layer 1. The side walls of this V-channel expose a plane 11—11' of a higher crystal order, that is, (311). With certain nonisotropic etchants, these side walls again exhibit slower etch rates than the (100) plane of the wafer surface. For example, a solution of 56.5 g of Na$_2$HPO$_4$.12H$_2$O in 300 ml of 30% H$_2$O$_2$ heated to 30° C. and adjusted to 7.60 pH by adding a 10 molar solution of NaOH and applied in a spray etching process for about 60 seconds can be used to selectively remove the p+ cap layer from the (100) surface 10 of the wafer. A proper metallization, e.g., Ti-Pt, then provides a non-blocking ohmic contact only to a stripe 8 of the p+ cap layer remaining along the V-channel for confining the current to the built-in lateral guiding structure underneath.

The self-aligned contacting technique in accordance with the invention is useful for the delineation of any non-planar guiding structures in a semiconductor device. The number of epitaxial layers required to be grown is not critical for this invention as long as the nonplanar feature and the required metallization contacting properties are maintained for the two topmost layers, for example, layers 1 and 2 in the figures. The technique in accordance with the invention is particularly useful for device structures incorporating arrays of channels or mesa stripes and for devices with single terrace stripes. This technique, in short, is applicable to any semiconducting materials or alloy systems which are suitable for fabricating multilayer hetero-structure-type diode lasers other than the GaAs/(GaAl)As system described herein whenever a top or cap layer, like layer 1 in the figures, is designed to form an ohmic low-resistance contact to a properly chosen metallization and a second layer next to the top layer, like layer 2 in the figures, is designed to provide a blocking contact to this metallization.

We claim:

1. A method of aligning contacts over a nonplanar feature on a semiconductor substrate comprising the steps of:

orienting the semiconductor substrate in a (100) crystal plane as a first preselected crystal plane;

etching the nonplanar feature into the crystallographically oriented surface of the first preselected crystal plane of the substrate along the normal vector of a second preselected crystal plane to expose a third preselected crystal plane;

growing a top epitaxy layer on the substrate over the nonplanar feature, wherein the portion of the top epitaxy layer conforming to the nonplanar feature forms a fourth preselected crystal plane;

free-etching the top layer non-isotropically to effect a differential etch rate between the first and fourth crystal planes to remove substantially only the portions of the top layer over the first crystal plane; and applying a contacting layer to the substrate over the top layer to provide differing contacts in response to the presence and absence of the top layer, thereby effecting a contact layer self-aligned to the nonplanar feature, wherein the second preselected crystal plane is (01$\bar{1}$) and the third and fourth preselected crystal planes are (111)A.

2. The method as in claim 1 wherein the step of free-etching further comprises using an etchant of 3:1:20 H$_2$SO$_4$: 30% H$_2$O$_2$:H$_2$O.

3. A method of aligning contacts over a nonplanar feature on a semiconductor substrate comprising the steps of:

orienting the semiconductor substrate in a (100) crystal plane as a first preselected crystal plane;

etching the nonplanar feature into the crystallographically oriented surface of the first preselected crystal plane of the substrate along the normal vector of a second preselected crystal plane to expose a third preselected crystal plane;

growing a top epitaxy layer on the substrate over the nonplanar feature, wherein the portion of the top epitaxy layer conforming to the nonplanar feature forms a fourth preselected crystal plane;

free-etching the top layer non-isotropically to effect a differential etch rate between the first and fourth crystal planes to remove substantially only the portions of the top layer over the first crystal plane; and applying a contacting layer to the substrate over the top layer to provide differing contacts in response to the presence and absence of the top layer, thereby effecting a contact layer self-aligned to the nonplanar feature, wherein the second preselected crystal plane is (01$\bar{1}$) and the fourth preselected crystal plane is (311).

4. The method as in claim 3, wherein the step of free-etching further comprises using an etchant of 56.5 g of Na$_2$HPO$_4$.12H$_2$O in 300 ml of 30% H$_2$O$_2$ heated to 30° C. and adjusted to 7.6 pH with a 10-molar solution of NaOH.

* * * * *

UNITED STATES PATENT AND TRADEMARK OFFICE
CERTIFICATE OF CORRECTION

PATENT NO. : 4,623,427
DATED      : November 18, 1986
INVENTOR(S) : Donald E. Ackley et al.

It is certified that error appears in the above-identified patent and that said Letters Patent is hereby corrected as shown below:

Column 3, Line 28, "(311)" should read -- $(3\bar{1}1)$ --.

Column 4, Line 56, "$(01\bar{1})$" should read -- (011) --.

Column 4, Line 57, "(311)" should read -- $(3\bar{1}1)$ --.

Signed and Sealed this

Third Day of November, 1987

Attest:

DONALD J. QUIGG

Attesting Officer

Commissioner of Patents and Trademarks